United States Patent

Cosimini et al.

[11] Patent Number: 4,587,636
[45] Date of Patent: May 6, 1986

[54] Y-DOMAIN MAGNETIC MEMORY SYSTEM

[75] Inventors: Gregory J. Cosimini, St. Paul; David S. Lo; Lawrence G. Zierhut, both of Burnsville, all of Minn.

[73] Assignee: Sperry Corporation, New York, N.Y.

[21] Appl. No.: 699,705

[22] Filed: Feb. 8, 1985

[51] Int. Cl.[4] ............................................. G11C 11/14
[52] U.S. Cl. ...................................................... 365/87
[58] Field of Search .................................. 365/87, 171

[56] References Cited

U.S. PATENT DOCUMENTS 4,100,609 7/1978 Schwee et al. ........................ 365/87
4,473,893 9/1984 Zierhut et al. ........................ 365/87

Primary Examiner—James W. Moffitt
Attorney, Agent, or Firm—Kenneth T. Grace; Marshall M. Truex

[57] ABSTRACT

The memory system incorporates a memory element storing binary digital data in the presence, vel non, of a Y-domain cross-tie. The memory element has a planar contour that is substantially symmetrical about a longitudinal axis and that has edge portions that are nowhere perpendicular or parallel to the longitudinal axis. A stabilizing magnetic field applied perpendicular to the longitudinal axis and in the plane of the memory element forms a first Neel wall along the longitudinal axis and causes the magnetization in the memory element to be formed into first and second domains on opposite sides of the Neel wall. When a writing magnetic field oriented in the plane of the memory element and perpendicular to the longitudinal axis but opposite to the stabilizing magnetic field orientation is coupled to the memory element, there is formed in the memory element a third domain separated from the first and second domains by second and third Neel walls having a join with one end of the first Neel wall. The first, second and third Neel walls form a "Y". Because of the nature of this third domain having its magnetization oriented in a direction parallel to the readout current caused to pass through the memory element, it produces a significantly greater difference in the readout signal between the readout of a stored 1 and a stored 0 than that achieved with the prior art cross-tie wall memory element.

10 Claims, 17 Drawing Figures

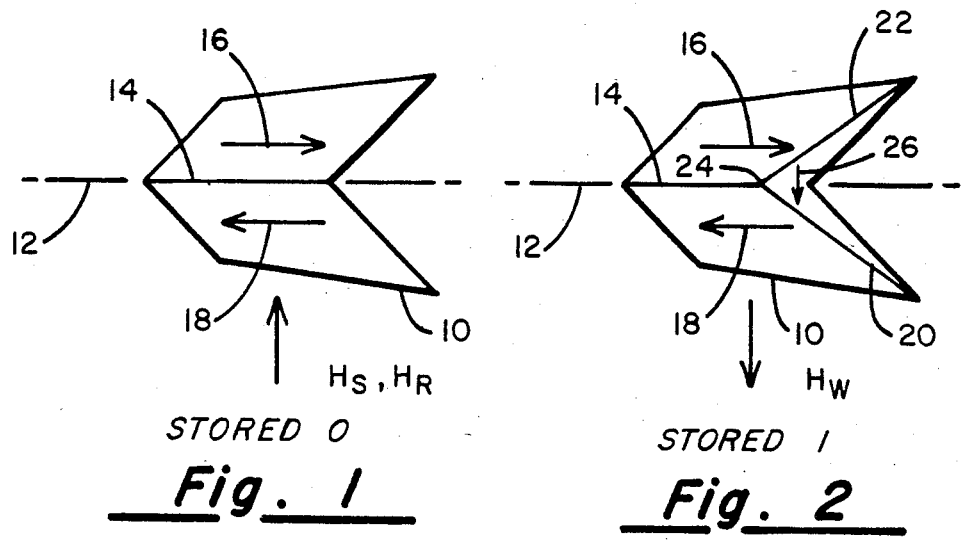
STORED 0
Fig. 1
STORED 1
Fig. 2
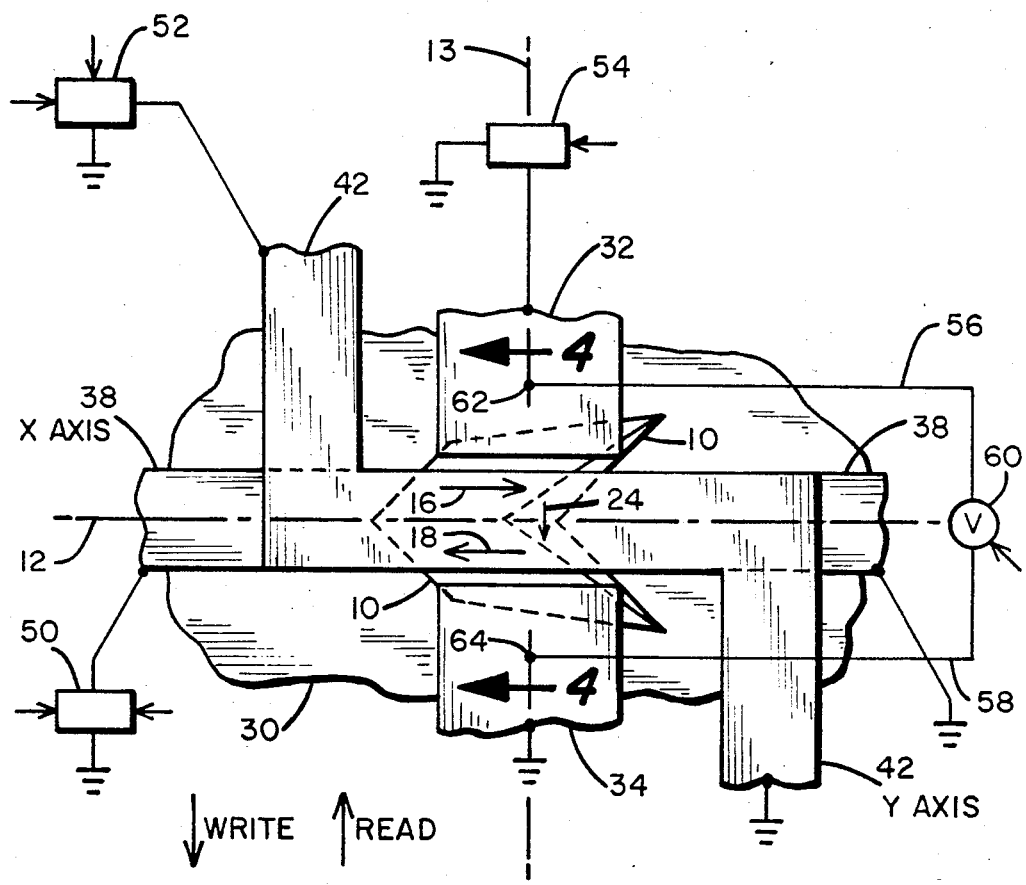
Fig. 3

Y-DOMAIN MAGNETIC MEMORY SYSTEM

BACKGROUND OF THE INVENTION

I. Field of the Invention

The present invention relates to the field of magnetic memory systems for the storage of binary digital data and in particular to magnetic memory systems that store binary digital data as the presence or absence of a magnetic domain in a thin ferromagnetic film layer.

II. Description of the Prior Art

The utilization of thin ferromagnetic films of approximately 81% Ni-19% Fe of approximately 350 Angstroms (Å) thick has been known since the early 1960s. Such thin ferromagnetic film memories may be formed by the evaporation or deposition process disclosed and claimed in the S. M. Rubens U.S. Pat. No. 2,900,282 and organized in the S. M. Rubens, et al U.S. Pat. No. 3,030,612 to form a multi-plane magnetizable memory system. Such technology later evolved to the utilization of electrically-alterable, random access memory systems that utilize the Mated-Film elements of the R. J. Bergman, et al U.S. Pat. No. 3,435,435.

Much later work in the area of thin ferromagnetic films resulted in the development of nondestructive readout, random access cross-tie wall memory systems such as exemplified by the L. G. Zierhut, et al U.S. Pat. No. 4,473,893. Such a cross-tie wall memory system has many advantages in that the discrete memory elements are a small size, each 10 microns ($\mu$m) in width and 15 $\mu$m in length, the small size of which permits the packaging of a three dimensional random access memory system that is both nonvolatile, e.g., retains its stored information upon the loss of power coupled thereto, and is substantially impervious to radiation.

However, such a cross-tie wall memory system does have a serious disadvantage in that its output signal, upon the detection of a stored 0 and a stored 1, is a function of the change in resistivity of the memory element because of the presence, vel non, of a crosstie, Bloch-line pair representing a stored 1. This change of resistivity of the cross-tie memory element produces two output signals of relatively small difference. Accordingly, it is desirable that there be provided a memory system having the desirable characteristics of the cross-tie wall memory system while providing a memory element that provides a significantly higher difference signal upon readout of a stored 0 or of a stored 1. The present invention is directed towards such a memory element.

SUMMARY OF THE INVENTION

In the present invention, the memory system incorporates the memory element of the above referenced U.S. Pat. No. 4,473,893; however, the method of storing the binary digital data is different in that the binary digital data is stored as the presence, vel non, of a Y-domain in contrast to the storage, vel non, of a cross-tie, Bloch-line pair of the U.S. Pat. No. 4,473,893. This storage element is a discrete planar magnetic memory element having a planar contour that is substantially symmetrical about a longitudinal axis and that has edge portions that are nowhere perpendicular or parallel to the longitudinal axis. A stabilizing magnetic field, when applied perpendicular to the longitudinal axis and in the plane of the memory element, forms a first Néel wall along the longitudinal axis and causes the magnetization in the memory element to be formed into first and second domains on opposite sides of the Néel wall. The magnetization in these first and second domains are oriented in substantially opposite directions, substantially parallel to the longitudinal axis.

When a writing magnetic field is coupled to the memory element, the writing magnetic field being oriented in the plane of the memory element, and perpendicular to the longitudinal axis but opposite to the stabilizing magnetic field orientation, there is formed in the memory element a third domain, which third domain is separated from the first and second domains by second and third Néel walls having a join with one end of the first Néel wall, the first, second and third Néel walls forming a Y. This generation of the third domain in the memory element by the writing magnetic field is indicative of a, e.g., stored 1, the absence of the storage of the third domain being representative of a, e.g., stored 0.

Because of the nature of this third domain having its magnetization oriented in a direction parallel to the readout current, which readout current is caused to pass through the memory element, it provides a significantly greater difference in the readout signal between the readout of a stored 1 and a stored 0. These significantly different readout signals, the, e.g., stored 1 readout signal being of significantly greater amplitude than that achieved with the cross-tie wall memory element, provide a memory element, in a corresponding magnetic memory system that provides greater margins of operability, and correspondingly, a magnetic memory system that is capable of very efficient operating characteristics.

BRIEF DESCRIPTION OF THE DRAWINGS

FIG. 1 is an illustration of the memory element of the present invention when in a stored 0 state.

FIG. 2 is an illustration of the memory element of the present invention when in a stored 1 state.

FIG. 3 is an illustration of the electronic circuitry used to operate the memory element of the present invention.

DESCRIPTION OF THE PREFERRED EMBODIMENT

Figure 4:
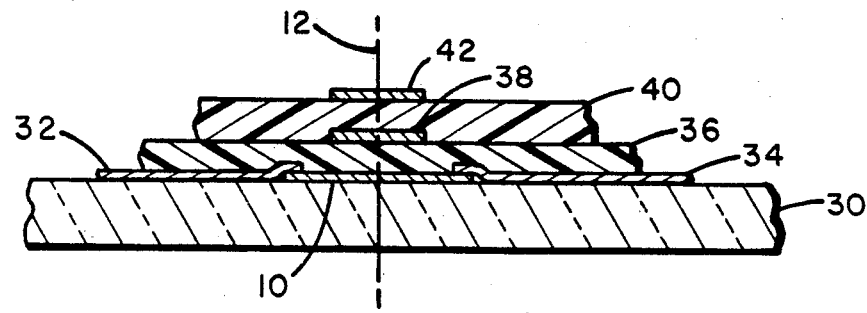
FIG. 4 is an illustration of a cross-sectional view of the memory system of FIG. 3 taken along line 4—4 thereof.

With particular reference to FIG. 1, there is presented an illustration of a plan view of the planar contour, or outline, of the memory element that is utilized by the present invention. This memory element 10 is similar in size and construction to the memory element of the herein above referenced U.S. Pat. No. 4,473,893. Memory element 10 is generally formed upon a suitable substrate material of a ferromagnetic film layer of approximately 81% Ni-19% Fe of approximately 350 Angstroms (Å) thick. Memory element 10 is a discrete planar magnetic memory element having a planar contour that is substantially symmetrical about a longitudinal axis 12. It has edge portions that are nowhere perpendicular or parallel to longitudinal axis 12 whereby a stabilizing magnetic field $H_S$ of an intensity that is substantially greater than the $H_K$ of the magnetic layer, when applied perpendicular to longitudinal axis 12 and in the plane of memory element 10 will form a first Néel wall 14 along longitudinal axis 12 and will cause the magnetization M in memory element 10 to be formed in first and second domains on opposite sides of the Néel wall 14. The magnetizations M in the first and second domains are oriented in substantially opposite directions, substantially parallel to longitudinal axis 12, as represented by magnetic vectors 16 and 18. This stabilizing magnetic field $H_S$, when inductively coupled to memory element 10, places the magnetization of element 10 in the magnetic state defined as a stored 0 state. The application of the stabilizing field of $H_S$ is required only once when the memory is being used for the first time.

With particular reference to FIG. 2, there is presented an illustration of the memory element 10 of FIG. 1 in the magnetic state defined as a stored 1 state. This stored 1 state is achieved by coupling a writing magnetic field $H_W$ to memory element 10, which writing magnetic field is oriented in the plane of memory element 10, perpendicular to longitudinal axis 12 and opposite to the orientation of the stabilizing magnetic field $H_S$ that achieved the stored 0 state of FIG. 1. This writing magnetic field $H_W$ is of a substantially lesser intensity than that of the stabilizing magnetic field $H_S$, whereby the writing magnetic field $H_W$ generates a third domain in memory element 10 that is separated from the first and second domains by a second Néel wall 20 and a third Néel wall 22, which first and second Néel walls 20, 22 have a join 24 with one end of the first Néel wall 14 for forming a Y. This third domain has its magnetization M oriented in a downward direction as represented by magnetic vector 26. This generation of the third magnetic domain in memory element 10 as represented by magnetic vector 26 is representative of a, e.g., stored 1 in memory element 10.

This novel Y-domain configuration of memory element 10, as represented in FIG. 2, provides a greatly enhanced readout characteristic as compared to the cross-tie, Bloch-line pair magnetic configuration of the memory element of the hereinabove referenced U.S. Pat. No. 4,473,893. Because of the greater proportional area of the third domain of the stored 1 state of the Y-domain memory element of the present invention, as compared to the relatively small area of the inverted Néel wall section between the cross-tie, Bloch-line pairs of the cross-tie wall memory system, the Y-domain memory system of the present invention provides a significantly higher readout 1 signal compared to a readout 0 signal. Additionally, the present invention permits the use of similar current drive pulses, in corresponding drive field intensities, for a write 1 and write 0 state. These features provide a more flexible signal enhancement process, allow more geometric tolerance in fabrication, and permit flexibility in memory system design.

With particular reference to FIG. 3, there is illustrated a plan view of a preferred embodiment of the present invention. This embodiment of the Y-domain memory system of the present invention is specifically designed to be incorporated within a nondestructive readout, random access memory system such as is disclosed in U.S. Pat. No. 4,473,893 while using the drive electronics, timing and signal magnitudes and intensities of the present invention.

Using FIG. 4 as a cross sectional view of the memory system of FIG. 3 taken along line 4—4 thereof, it can be seen that the memory system of FIG. 3 includes a substrate member 30 upon which are successively deposited the following elements:

Memory element 10 formed of approximately 81% Ni-19% Fe approximately 350 Å thick.

Gold striplines 32, 34 approximately 1,000 Å thick.

SiO insulative layer 36 of approximately 12,500 Å thick.

Gold X axis stripline 38 of approximately 1,000 Å thick.

SiO insulative layer 40 of approximately 12,500 Å thick.

Gold Y axis stripline 42 of approximately 1,000Å thick.

Figure 5:
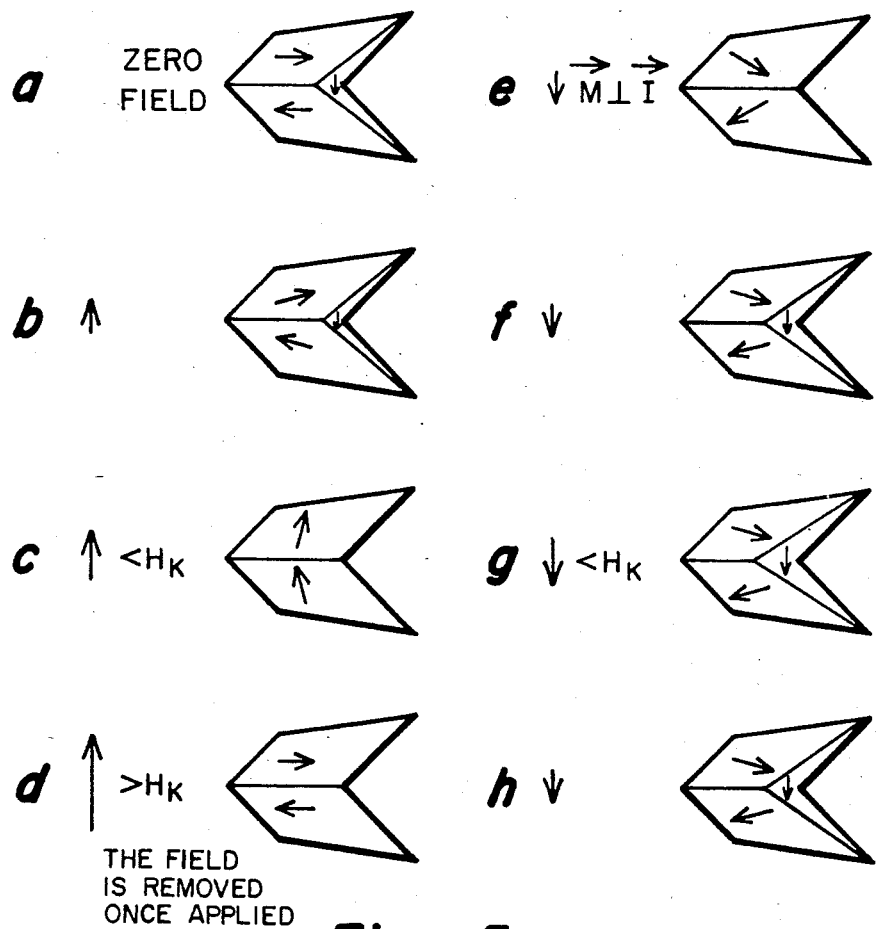
FIG. 5a through FIG. 5h are illustrations of the magnetic states of the memory element of the present invention when subjected to the associated magnetic fields H.
Figure 6:
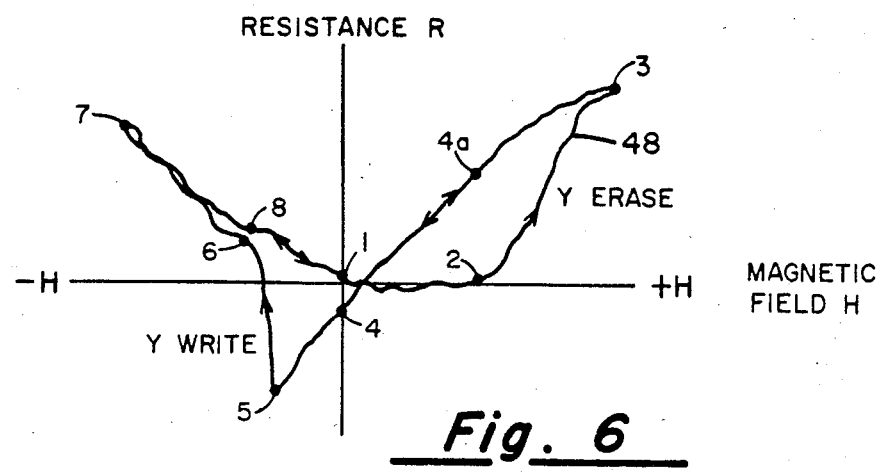
FIG. 6 is an illustration of the plot of resistance versus applied magnetic field of the memory element of the present invention.

For the purpose of providing a better understanding of the present invention, there are provided, in FIGS. 5a through 5h, illustrations of the magnetic states of memory element 10 when subjected to or after having been subjected to the respective magnetic fields associated with the representations of the magnetic fields of FIGS. 5a through 5h. In FIG. 6 there is illustrated a plot of the resistance R versus magnetic field H as a hysteresis loop 48 of memory element 10 when subjected to the respective magnetic fields of FIGS. 5a through 5h. With an upwardly directed magnetic field H, as illustrated in FIGS. 5b through 5d, corresponding to a positively directed magnetic field H in FIG. 6, the magnetic states of memory element 10, as illustrated in FIGS. 5a through 5h with the corresponding resistance R states of FIG. 6 will now be explained.

With the magnetization of memory element 10 in an initial stored 1 state, with a zero applied magnetic field, as illustrated in FIG. 5a, the resistance R versus magnetic field H hysteresis loop of FIG. 6 is at a point 1 along the resistance axis. When a relatively low intensity positive magnetic field is coupled to memory element 10, its magnetic state is as represented by FIG. 5b when its resistance state is moved from point 1 to point 2 of FIG. 6. When a slightly larger intensity positive magnetic field is now coupled to magnetic element 10, the magnetic state of memory element 10 is as illustrated in FIG. 5c wherein its resistance state is moved to point 3 along the hysteresis loop of FIG. 6. Now, when a relatively intense positive magnetic field, i.e., a magnetic field larger than the $H_K$ of the magnetic material of memory element 10, is applied to and then removed from memory element 10, its magnetic state is as illustrated in FIG. 5d with its resistance having passed along the hysteresis loop from point 3 to point 4a to reside at point 4 along the resistance axis as illustrated in FIG. 6.

Now, when a relatively low intensity negative magnetic field is coupled to memory element 10, its magnetic state is as illustrated in FIG. 5e with its resistance state being moved along the hysteresis loop of FIG. 6 to reside at point 5. Now, when a slightly more intense negative magnetic field is coupled to memory element 10, its magnetic state is as illustrated in FIG. 5f, wherein there is created in memory element 10 a third domain with its magnetization, upon the cessation of this magnetic field, oriented in a downwardly direction, perpendicular to the magnetization as illustrated by the magnetic vectors in the other two magnetic domains of memory element 10. This resistance value of memory element 10 is as illustrated at point 6 of the hysteresis loop of FIG. 6. When a slightly larger negative magnetic field, less than the $H_K$ of the magnetic material of memory element 10, is then coupled to memory element 10, the magnetic state of memory element 10 is as illustrated in FIG. 5g, while its resistance state is as illustrated as at point 7 along the hysteresis loop of FIG. 6. Subsequently, when a relatively low intensity negative magnetic field, such as that applied with respect to the illustration of FIG. 5f, is coupled to magnetic element 10, its magnetic state is as illustrated in FIG. 5h, whereby its resistance state is as at point 8 of the hysteresis loop of FIG. 6. Subsequently, when all magnetic fields are then removed from magnetic element 10, its magnetic state is as illustrated in FIG. 5a, whereupon its resistance state is at point 1 along the resistance axis of FIG. 6.

Figure 7:
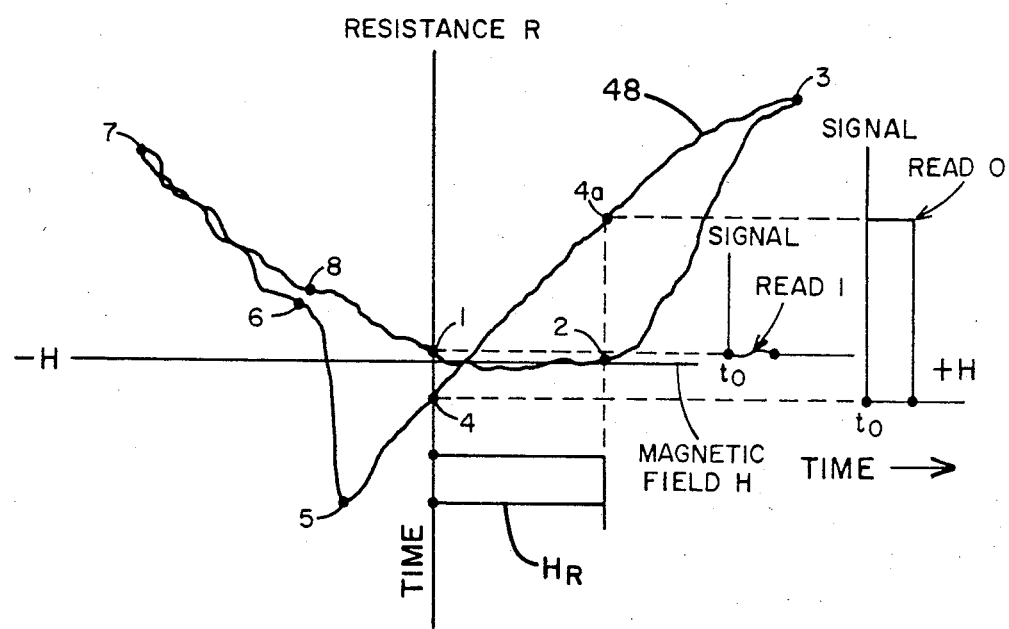
FIG. 7 is an illustration of the plot of the output signal versus resistance state of the plot of FIG. 6.

With particular reference to FIG. 7, there is illustrated a plot of the read drive field $H_R$ and the resulting read 1 and read 0 output signals as a function of the plot of the resistance R versus magnetic field H hysteresis loop of FIG. 6. Note that the read field $H_R$ is smaller than the write field $H_W$. FIG. 7 illustrates that with the magnetization of memory element 10 being in a magnetic state representative of a stored 0 with its resistance state being at point 4 of the hysteresis loop, the change of resistance $\Delta R$ upon the subjection of the read drive field $H_R$ causes the resistance state of memory element 10 to change from point 4 to point 4a, whereupon there is produced a significant output for the 0 state. This is in sharp contrast to the insignificant output for the 1 state produced by memory 10 upon its subjection to the read drive field $H_R$ when its resistance state moves from point 1 to point 2 on the hysteresis loop of FIG. 7. This sharp distinction between the amplitude and the polarity of the output signals for a stored 0 and a stored 1 provide a magnetic memory system that provides greatly distinctive output signals for its two binary informational states.

Figure 8:
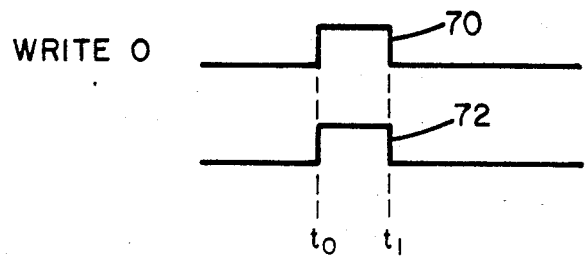
FIG. 8 is an illustration of the timing diagram associated with a Write 0 operation.

With reference back to FIG. 3, there will now be presented a discussion of the writing and reading operations of the present invention. With particular reference to FIG. 8, there is presented an illustration of the timing diagram associated with a Write 0 operation. For the purpose of the discussion of this operation, it is assumed that the memory element 10 has been subjected to a stabilizing magnetic field $H_S$ whereby the magnetic state of memory element 10 is as is illustrated in FIG. 5d as discussed hereinabove, with particular reference to FIG. 5 and FIG. 6. At a time $t_0$ both drive amplifier 50 and drive amplifier 52 simultaneously couple write current pulses 70, 72 to their respectively associated X-axis stripline 38 and Y-axis stripline 42, wherein the magnetic state of memory element 10 after the cessation of such write drive fields at time $t_1$, is in the magnetic state as illustrated in FIG. 5d. Both write current pulses are of substantially identical waveforms of 100 nanoseconds (ns) in duration and of 19 milliamps (mA) in amplitude. Experimental data shows that write currents of 10 milliamperes with a duration of 20 ns are expected when the circuitry is improved.

Figure 9:
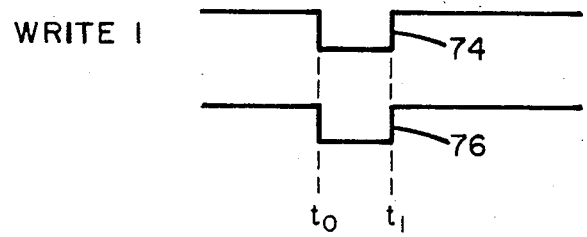
FIG. 9 is an illustration of the timing diagram associated with a Write 1 operation.

For the Write 1 operation such as illustrated with particular reference to FIG. 9, the substantially similar write current pulses 74, 76, but of opposite polarity, are coupled to the X-axis stripline 38 and the Y-axis stripline 42 by their respective drive amplifiers 50 and 52. After the cessation of the write current pulses as illustrated in FIG. 9, the magnetic state of memory element 10 is as is illustrated in FIG. 5a.

Figure 10:
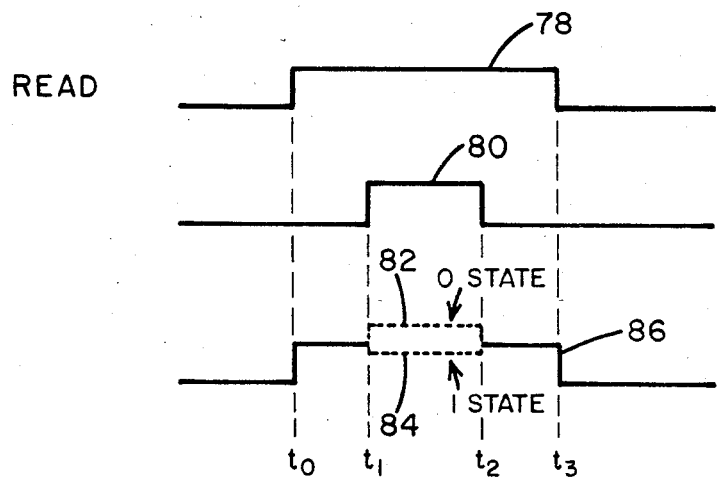
FIG. 10 is an illustration of the timing diagram associated with a Read operation.

With particular reference to FIG. 10, there is presented an illustration of a timing diagram associated with a Read operation whereby the previously written 0 or 1 are readout as an output voltage signal via voltmeter 60 and the associated output conductors 56 and 58 coupled across nodes 62 and 64 of gold striplines 32 and 34, respectively. With respect to the Read operation, at time $t_0$ drive amplifier 54 couples a read current pulse 78 to gold stripline 32, whereby such read current pulse 78 flows from gold stripline 32 through memory element 10 to gold stripline 34 and thence to ground. Concurrently, as at time $t_0$, voltmeter 60 detects a voltage difference pulse 86 between nodes 62 and 64 of, e.g., approximately 0.2 volt.

Subsequently, at time $t_1$ drive amplifier 50 couples a read current pulse 80 to X-axis stripline 38 for a duration of approximately 200 ns, as from time $t_1$ to time $t_2$, whereupon voltmeter 60 detects across nodes 62 and 64 a read output signal voltage 82 of approximately 200 microvolts in amplitude for a stored 0 state or a substantially negligible (or negative) output voltage 84 for a stored 1 state. Subsequently, as at a time $t_3$, drive amplifier 54 terminates the coupling of its read current pulse 80 to gold stripline 32.

For a typical operation of the memory system of the present invention, as illustrated in FIG. 3, the read current pulse from drive amplifier 54 is of 400 ns in duration and 4 mA in amplitude, the read current pulse coupled by drive amplifier 50 to X-axis stripline 38 is of 200 ns in duration and 8 mA in amplitude while the output voltage signal detected by voltmeter 60 is of 400 ns in duration and 0.2 volts amplitude, with the difference between the readout of a stored 1 state and a stored 0 state being approximately 200 microvolts (uv). This output voltage signal differential between a stored 1 state and a stored 0 state is of substantially greater significance than that previously achieved with the crosstie wall memory system such as that of the U.S. Pat. No. 4,473,893. Accordingly, the present invention provides a magnetic memory system that has a substantially improved performance characteristic over that achieved by magnetic memory systems of substantially similar size and operating characteristics.

What is claimed is:

1. A Y-domain magnetic memory system, comprising:
   a discrete planar magnetic memory element having a planar contour that is substantially symmetrical about a longitudinal axis;
   means coupling a first writing magnetic field to said memory element for forming a Néel wall along said longitudinal axis and for forming first and second domains on opposite sides of said Néel wall; and,
   means coupling a second writing magnetic field to said memory element for forming a third domain in said memory element, which third domain is separated from said first and second domains by second and third Néel walls having a join with one end of said first Néel wall, said first, second and third Néel walls forming a Y.

2. The Y-domain magnetic memory system of claim 1 further comprising
   readout means coupled to said memory element for detecting the presence or absence of said third domain.

3. The Y-domain magnetic memory system of claim 1 wherein said first and second writing magnetic fields are of substantially the same amplitude and duration but are of opposite polarity.

4. A Y-domain magnetic memory system, comprising:
   a discrete planar magnetic memory element having a planar contour that is substantially symmetrical about a longitudinal axis and that has edge portions that are substantially nowhere perpendicular or parallel to said longitudinal axis;
   means coupling a first magnetic field to said memory element, which first magnetic field is oriented substantially perpendicular to said longitudinal axis and in the plane of said memory element, for generating a first Néel wall along said longitudinal axis and for generating first and second domains on opposite sides of said Néel wall; and,
   means coupling a second magnetic field to said memory element, which second magnetic field is oriented in the plane of said memory element and is perpendicular to said longitudinal axis and opposite to said first magnetic field orientation for generating a third domain in said memory element, which third domain is separated from said first and second domains by second and third Néel walls having a join with one end of said first Néel wall, said first, second and third Néel walls forming a Y; and
   means coupled to said memory element for detecting the presence or absence of said third domain.

5. The Y-domain magnetic memory system of claim 4 wherein
   said second magnetic field orients the magnetization in said third domain substantially perpendicular to said longitudinal axis.

6. The Y-domain magnetic memory system of claim 5 wherein
   said first magnetic field orients the magnetizations in said first and second domains substantially parallel but in opposite orientation and on opposite sides of said longitudinal axis.

7. A Y-domain magnetic memory system, comprising:
   a discrete planar magnetic memory element having a planar outline that is substantially symmetrical about a longitudinal axis and that has edge portions that are substantially nowhere perpendicular or parallel to said longitudinal axis whereby a first magnetic field, when applied perpendicular to said longitudinal axis and in the plane of said memory element, will generate a first Néel wall along said longitudinal axis and will orient the magnetization in said memory element in first and second domains on opposite sides of said first Néel wall, with the magnetizations in said first and second domains being oriented in substantially opposite directions, substantially parallel to said longitudinal axis;
   means coupling said first magnetic field to said memory element for generating said first Néel wall substantially along said longitudinal axis and for generating said first and second domains on opposite sides of said first Néel wall;
   means coupling a second magnetic field to said memory element, said second magnetic field being oriented in the plane of said memory element and perpendicular to said longitudinal axis and of opposite orientation to said first magnetic field for generating a third domain in said memory element, which third domain is separated from said first and second domains by second and third Néel walls having a join with one end of said first Néel wall, said first, second and third Néel walls forming a Y; and
   means coupled to said memory element for detecting the presence or absence of said third domain 8. A method of operating a discrete planar thin magnetic layer, which is substantially symmetrical about a longitudinal axis, as a bistable memory device, comprising:
   coupling a first magnetic field perpendicular to said longitudinal axis and in the plane of said magnetic layer;
   forming first and second domains and a first Néel wall in said magnetic layer, said first Néel wall oriented substantially along said longitudinal axis and said first and second domains oriented on opposite sides of and separated by said first Néel wall with their magnetizations oriented in substantially opposite directions, substantially parallel to said first Néel wall, said first and second domains separated by said first Néel wall being representative of a first bistable informational state;
   coupling a second magnetic field perpendicular to said longitudinal axis and in the plane of said magnetic layer and of opposite orientation to said first magnetic field; and,
   forming a third domain and second and third Néel walls in said magnetic layer, said second and third Néel walls having a join with one end of said first Néel wall forming a Y, said first, second and third domains separated by said first, second and third Néel walls being representative of a second bistable informational state.

9. The method of claim 8 further including
   coupling a read current pulse to flow through said magnetic layer; and,
   coupling a third magnetic field perpendicular to said longitudinal axis and in the plane of said magnetic layer and parallel to said first magnetic field
   detecting the magnetization of said magnetic layer being in said first or said second bistable informational state as a resistance difference to the flow of said read current pulse through said magnetic layer.

10. A method of operating a discrete planar thin magnetic layer that is substantially symmetrical about a longitudinal axis as a bistable memory device, comprising:

coupling a first magnetic field perpendicular to said longitudinal axis and in the plane of said magnetic layer for forming first and second domains in said layer that are on opposite sides of a Néel wall that is oriented substantially along said longitudinal axis, with the magnetizations in said first and second domains oriented in substantially opposite directions substantially parallel to said longitudinal axis, said first magnetic field establishing said magnetic layer in a first informational state coupling a second magnetic field perpendicular to said longitudinal axis and in the plane of said magnetic layer for forming a third domain in said magnetic layer, which third domain is separated from said first and second domains by second and third Néel walls having a join with one end of said first Néel wall, said first, second and third Néel walls forming a Y, said second magnetic field establishing said magnetic layer in a second informational state; and, affecting said magnetic layer for determining its alternative first or second information state.

* * * * *